United States Patent
Ito et al.

(10) Patent No.: US 8,266,808 B2
(45) Date of Patent: Sep. 18, 2012

(54) PORTABLE ELECTRONIC APPARATUS AND GEOMAGNETISM SENSOR CALIBRATION METHOD

(75) Inventors: Kazuto Ito, Kanagawa (JP); Yasuhiro Ueno, Kanagawa (JP)

(73) Assignee: Kyocera Corporation, Kyoto (JP)

( * ) Notice: Subject to any disclaimer, the term of this patent is extended or adjusted under 35 U.S.C. 154(b) by 799 days.

(21) Appl. No.: 12/295,471

(22) PCT Filed: Mar. 29, 2007

(86) PCT No.: PCT/JP2007/056833
§ 371 (c)(1),
(2), (4) Date: Mar. 12, 2009

(87) PCT Pub. No.: WO2007/114235
PCT Pub. Date: Oct. 11, 2007

(65) Prior Publication Data
US 2009/0320305 A1 Dec. 31, 2009

(30) Foreign Application Priority Data
Mar. 30, 2006 (JP) .................................. 2006-096155

(51) Int. Cl.
*G01C 17/38* (2006.01)
*G06F 19/00* (2011.01)
(52) U.S. Cl. ................................ 33/356; 33/303; 702/92
(58) Field of Classification Search .................... 33/303, 33/356; 702/92; 701/224, 530
See application file for complete search history.

(56) References Cited

U.S. PATENT DOCUMENTS

| | | | |
|---|---|---|---|
| 6,611,693 B2 * | 8/2003 | Soini et al. | 455/556.1 |
| 6,731,958 B1 * | 5/2004 | Shirai | 455/574 |
| 6,778,006 B2 * | 8/2004 | Lin | 327/540 |
| 7,463,255 B2 * | 12/2008 | Yang | 345/211 |
| 8,001,406 B2 * | 8/2011 | Choi et al. | 713/323 |
| 2004/0030943 A1 * | 2/2004 | Ishidera et al. | 713/320 |
| 2004/0254727 A1 * | 12/2004 | Ockerse et al. | 701/224 |
| 2005/0054372 A1 * | 3/2005 | Tsuda et al. | 455/550.1 |
| 2005/0283988 A1 | 12/2005 | Sato et al. | 33/356 |
| 2009/0167295 A1 * | 7/2009 | Chen et al. | 324/202 |
| 2011/0071759 A1 * | 3/2011 | Pande et al. | 701/213 |
| 2012/0101766 A1 * | 4/2012 | Snow et al. | 702/104 |

FOREIGN PATENT DOCUMENTS

JP 2003-333175 A 11/2003

(Continued)

OTHER PUBLICATIONS

Chinese language office action and its English language translation for corresponding Chinese application 200780010937.5, dispatch date Nov. 9, 2010.

(Continued)

*Primary Examiner* — R. A. Smith
(74) *Attorney, Agent, or Firm* — DLA Piper LLP (US)

(57) ABSTRACT

A portable electronic apparatus calibrates a geomagnetism sensor at a suitable timing. When a key is operated in a power-saving mode, the power-saving mode ends, and a detection value of a geomagnetism sensor is calibrated. The calibration is executed in a state where a user tries to view a screen of a display part, therefore the calibration is executed in a state where an angle of housings with respect to the horizontal plane is suitable, and a calculation precision of a bearing is improved. By executing calibration during activation of the navigation application useless calibration is not carried out, and an increase of power consumed is suppressed.

12 Claims, 8 Drawing Sheets

FOREIGN PATENT DOCUMENTS

| | | |
|---|---|---|
| JP | 2005-291931 A | 10/2005 |
| JP | 2005-291932 A | 10/2005 |
| JP | 2005-291933 A | 10/2005 |
| JP | 2005-291934 A | 10/2005 |
| JP | 2005-291935 A | 10/2005 |
| JP | 2005-291936 A | 10/2005 |
| JP | 2005-345140 A | 12/2005 |
| JP | 2005-345387 A | 12/2005 |
| JP | 2005-345388 A | 12/2005 |
| JP | 2006-023293 A | 1/2006 |
| JP | 2008268015 A * | 11/2008 |
| JP | 2009175169 A * | 8/2009 |

OTHER PUBLICATIONS

English translation of Korean office action dated Nov. 9, 2010 for corresponding Korean application 1020087026494.

* cited by examiner

PORTABLE ELECTRONIC APPARATUS AND GEOMAGNETISM SENSOR CALIBRATION METHOD

CROSS-REFERENCE TO RELATED APPLICATIONS

This application is a national stage of International Application No. PCT/JP2007/056833. filed on Mar. 29, 2007, and claims the benefit of priority under 35 USC 119 of Japanese Patent Application No. 2006-096155, filed on Mar. 30, 2006, which are incorporated herein by reference.

TECHNICAL FIELD

The present invention relates to a portable electronic apparatus provided with a geomagnetism sensor and a geomagnetism sensor calibration method.

BACKGROUND ART

Mobile phones provided with a navigation function utilizing GPS (Global Positioning System) to display a geographical position of the present location have been put into practical use. In this type of mobile phone, generally a geomagnetism sensor is mounted. It is possible to display a bearing together with the present location. For example, by the so-called "heading up" display method rotating a display direction of a map to match an advancing direction may be used to display the present position and the advancing direction in a manner easily understandable to a user.

A geomagnetism sensor uses, for example, a magnetoresistance device or other magnetism detection device to detect the intensity of geomagnetism in a plurality of directions (usually biaxial directions or triaxial directions). However, geomagnetism is very weak, therefore a detection value of a geomagnetism sensor is easily affected by other magnetism. In particular, magnetism generated in parts inside an electronic apparatus in which a geomagnetism sensor is mounted becomes a major cause of error of the detection value of the geomagnetism. The magnetism generated inside an electronic apparatus creates a constant magnetic field inside the electronic apparatus no matter which direction the electronic apparatus is directed in, therefore this causes a fixed error (offset) in the detection value of the geomagnetism. In order for the geomagnetism sensor to detect the geomagnetism with a good precision, calibration for estimating this offset and eliminating it from the detection value of the sensor becomes indispensable. Patent Documents 1 to 8 disclose technologies concerning calibration of a geomagnetism sensor mounted in a portable electronic apparatus.

Patent Document 1: Japanese Patent Publication (A) No. 2005-291931
Patent Document 2: Japanese Patent Publication (A) No. 2005-291932
Patent Document 3: Japanese Patent Publication (A) No. 2005-291933
Patent Document 4: Japanese Patent Publication (A) No. 2005-291934
Patent Document 5: Japanese Patent Publication (A) No. 2005-291935
Patent Document 6: Japanese Patent Publication (A) No. 2005-291936
Patent Document 7: Japanese Patent Publication (A) No. 2005-291937
Patent Document 8: Japanese Patent Publication (A) No. 2005-291938

DISCLOSURE OF THE INVENTION

Technical Problem

In general, a triaxial type geomagnetism sensor can be automatically calibrated, but a biaxial type geomagnetism sensor has to be manually calibrated. For example, the user holds the housings of the portable electronic apparatus horizontal relative to the horizontal plane and shakes them right and left or rotates them during which the geomagnetism sensor detects the geomagnetism in a plurality of directions. An offset value caused by the magnetism inside the portable electronic apparatus is estimated by using the detection values of the geomagnetism in a plurality of directions acquired in this way.

The timing of the calibration operation is generally left to the sense of the user. The calibration is carried out when the user feels that the display of the bearing is different from the actual one. A change of the magnetic field inside the portable electronic apparatus causing recalibration to become necessary occurs when a part inside the apparatus receives a relatively strong magnetic field from the outside and is magnetized (for example, when a magnet of an earphone is brought close to the apparatus). However, the user cannot directly learn of such a change of the external magnetic field, therefore there is the problem that in a portable electronic apparatus where the calibration operation is carried out by judgment of the user, the bearing continues to be displayed in the state with a large error in many cases.

From the above, it is desirable to provide a portable electronic apparatus able to execute processing concerning the calibration of a geomagnetism sensor at a suitable timing and a method of calibration of a geomagnetism sensor.

Technical Solution

A portable electronic apparatus of the present invention is provided with a geomagnetism sensor detecting geomagnetism, a display part configured to display information, an input part configured to input an instruction, and a control part configured to calculate a bearing based on a detection value of the geomagnetism sensor and to display information of the bearing on the display part, wherein the control part can execute power-saving processing shifting to a power-saving mode reducing power consumed by the display part when no instruction is input to the input part for a predetermined time or more and calibration-related processing concerning calibration of the geomagnetism sensor and, when an instruction is input to the input part in the power-saving mode, ends the power-saving mode and executes the calibration-related processing.

The control part may execute the calibration-related processing after a predetermined waiting time passes after input by the input part occurs in the power-saving mode.

The control part may execute the calibration-related processing after a predetermined waiting time further passes from the next input when the next input by the input part occurs before the elapse of the predetermined waiting time.

The control part may execute processing in response to an instruction input at the input part before executing the calibration-related processing when the input at the input part occurs in the power-saving mode.

The apparatus may be provided with housings composed to be able to cover a screen of the display part, and the control part does not have to execute the calibration-related processing when the housings are in a state where the screen of the display part is covered.

The control part may execute the calibration-related processing when the power-saving mode ends in response to an input of an instruction to the input part after a shift to the power-saving mode occurs in a state where processing concerning calculation and display of the bearing is executed.

The control part may execute calibration-related processing when the power-saving mode ends by input, to the input part, of an instruction different from the instruction controlling the progress of the processing concerning the calculation and display of the bearing after a shift to the power-saving mode occurs in a state where processing concerning the calculation and display of the bearing is executed.

Alternatively, a portable electronic apparatus of the present invention is provided with a geomagnetism sensor detecting geomagnetism, a display part configured to display information, housings composed so that the screen of the display part can be covered, an input part configured to input an instruction, and a control part configured to calculate a bearing based on a detection value of the geomagnetism sensor and to display information of the bearing on the display part, wherein the control part can execute calibration-related processing concerning the calibration of the geomagnetism sensor, in the state where the screen of the display part is covered while the control part executes the processing concerning the calculation of the bearing, the control part executes the calibration-related processing after the covered state is cancelled.

Alternatively, a portable electronic apparatus of the present invention is provided with a geomagnetism sensor detecting geomagnetism, a display part configured to display information, an input part configured to input an instruction, housings composed so that at least a part of the input part can be shielded, and a control part configured to calculate a bearing based on a detection value of the geomagnetism sensor and to display information of the bearing on the display part, wherein the control part can execute calibration-related processing concerning the calibration of the geomagnetism sensor, in the state where at least a part of the input part is covered while the control part executes the processing concerning the calculation of the bearing, the control part executes the calibration-related processing after the covered state is cancelled.

The control part may execute the calibration-related processing when the covered input part is operated after the covered state of at least a part of the input part is cancelled.

The control part may execute the calibration-related processing when the covered input part is operated after the cancellation of the covered state of at least a part of the input part, and the operation is an instruction which is different from an instruction controlling the progress of the processing.

A method of calibration of a geomagnetism sensor of the present invention relates to a method of calibration of a geomagnetism sensor in the portable electronic apparatus provided with a geomagnetism sensor detecting geomagnetism, a display part configured to display information, and an input part inputting an instruction. This method of calibration of a geomagnetism sensor has a bearing identifying step calculating a bearing based on a detection value of the geomagnetism sensor and displaying information of the bearing on the display part, a power-saving step shifting to a power-saving mode reducing the power consumed by the display part when an instruction is not input for a predetermined time or more at the input part, and a calibration step calibrating the geomagnetism sensor or reporting the calibration, and ends the power-saving mode and executes the calibration step when an instruction is input to the input part in the power-saving mode.

Advantageous Effects

According to the present invention, processing concerning the calibration of the geomagnetism sensor can be executed at a suitable timing.

EXPLANATION OF REFERENCES

101 . . . wireless communication portion, 102 . . . GPS signal reception portion, 103 . . . key input part, 104 . . . audio processing portion, 105 . . . speaker, 106 . . . microphone, 107 . . . display part, 108 . . . memory portion, 109 . . . open/closed judgment portion, 110 . . . geomagnetism sensor, and 120 . . . control part.

BEST MODE FOR CARRYING OUT THE INVENTION

Below, an explanation will be given of a portable electronic apparatus of the present invention applied to a multi-function type mobile phone mounting a GPS navigation function therein.

Figure 1:
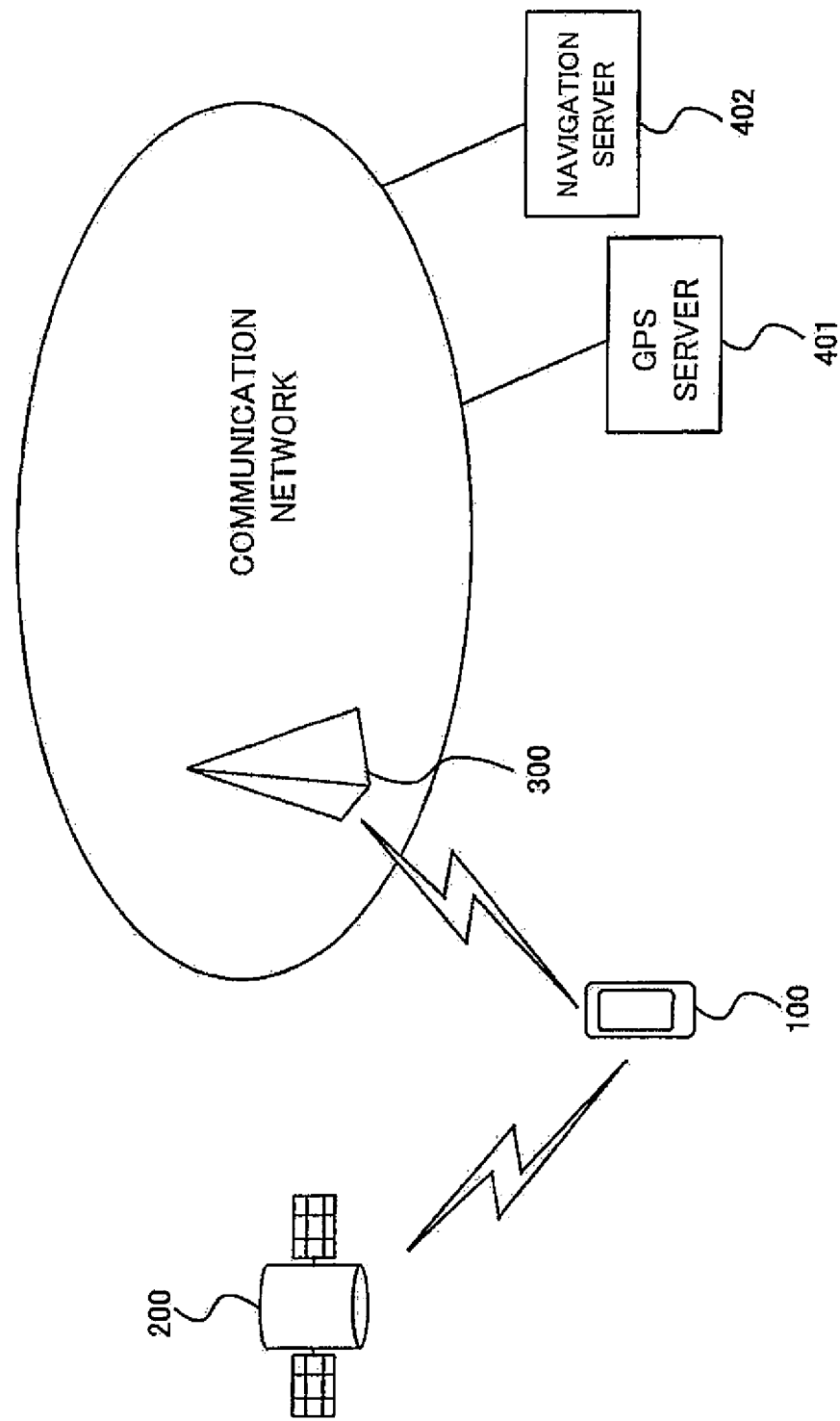
FIG. 1 A diagram showing an example of the configuration of a system for acquiring a geographical position and information of a map in a mobile phone (portable electronic apparatus) according to an embodiment of the present invention.

FIG. 1 is a diagram showing an example of the configuration of a system for acquiring a geographical position and information of a map in a mobile phone (portable electronic apparatus) 100 according to an embodiment of the present invention.

The mobile phone 100 receives GPS signals transmitted from three or more GPS satellites 200 in known orbits. Then, information concerning the received GS signals is transmitted from a base station 300 through a communication network to a GPS server 401. The position information of the present location is acquired from the GPS server 401. Further, the mobile phone 100 transmits position information of the present location acquired from the GPS server 401 from the base station 300 through the communication network to a navigation server 402 and acquires the information of a map of the periphery of the present location from the navigation server 402.

Based on the information of the GPS signal sent from the mobile phone 100 via the communication network, the GPS server 401 calculates the geographical position (for example, latitude and longitude) of the mobile phone 100. Then, it transmits the calculated position information through the communication network and the base station 300 to the mobile phone 100.

Based on the position information sent from the mobile phone 100 via the communication network, the navigation server 402 retrieves the information of the map of the periphery of the mobile phone 100 from the database. Then, it transmits the retrieved map information through the communication network and the base station 300 to the mobile phone 100.

Figure 2:
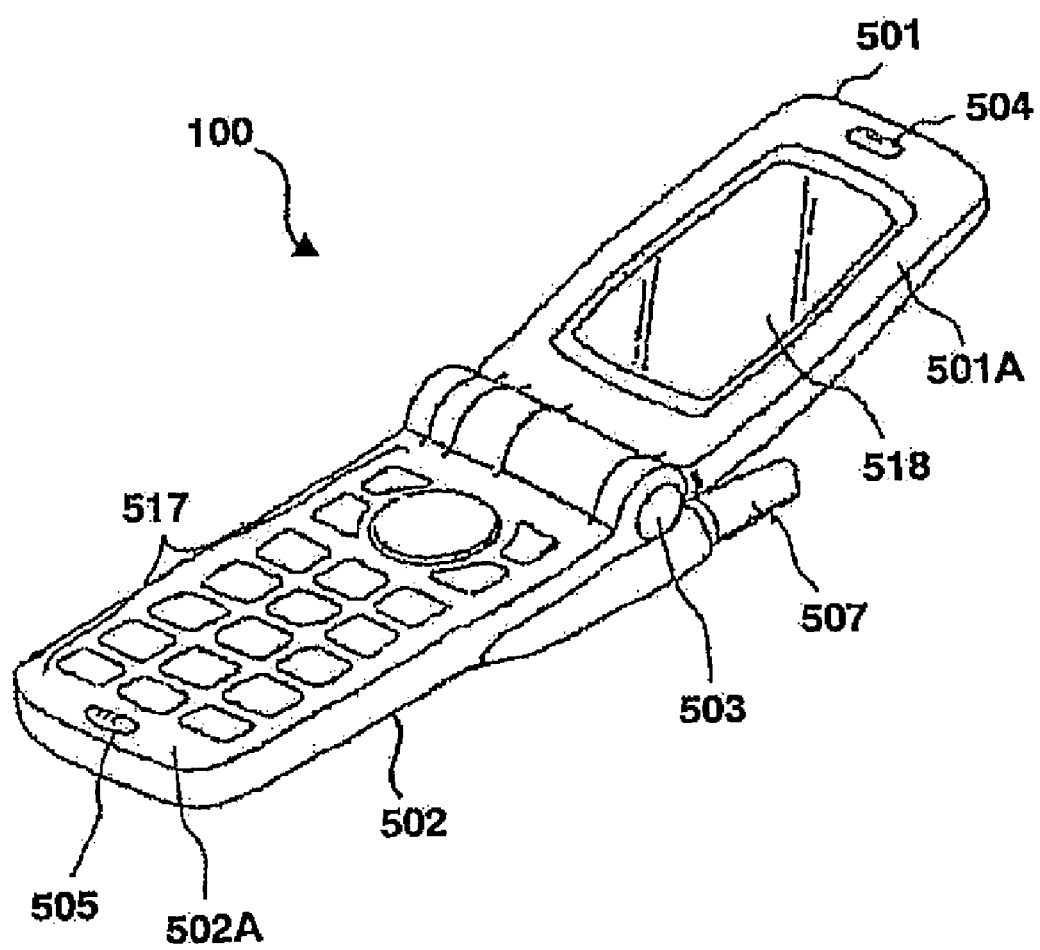
FIG. 2 A diagram showing an example of an outer appearance of a mobile phone.

FIG. 2 is a diagram showing an example of the outer appearance of the mobile phone 100.

The mobile phone 100, as shown in FIG. 2, has a first housing (upper housing) 501 and a second housing (lower housing) 502. These two housings 501 and 502 can be opened/closed relative to each other by being connected via a hinge portion 503 so that they can be freely folded up.

In the folded up state (closed state), on a surface 501A of the first housing 501 facing the second housing 502, a display part 518 (107 of FIG. 3) and a speaker 504 (105 of FIG. 3) are arranged. On a surface 502A of the second housing 502 facing the first housing 501 in the closed state, a key input part 517 (103 of FIG. 3) and a microphone 505 (106 of FIG. 3) are arranged. In the hinge portion 503 of the second housing 502, an antenna 507 (AT1 of FIG. 3) for wireless communication with the base station 300 and which can be freely extended and contracted is arranged.

Figure 3:
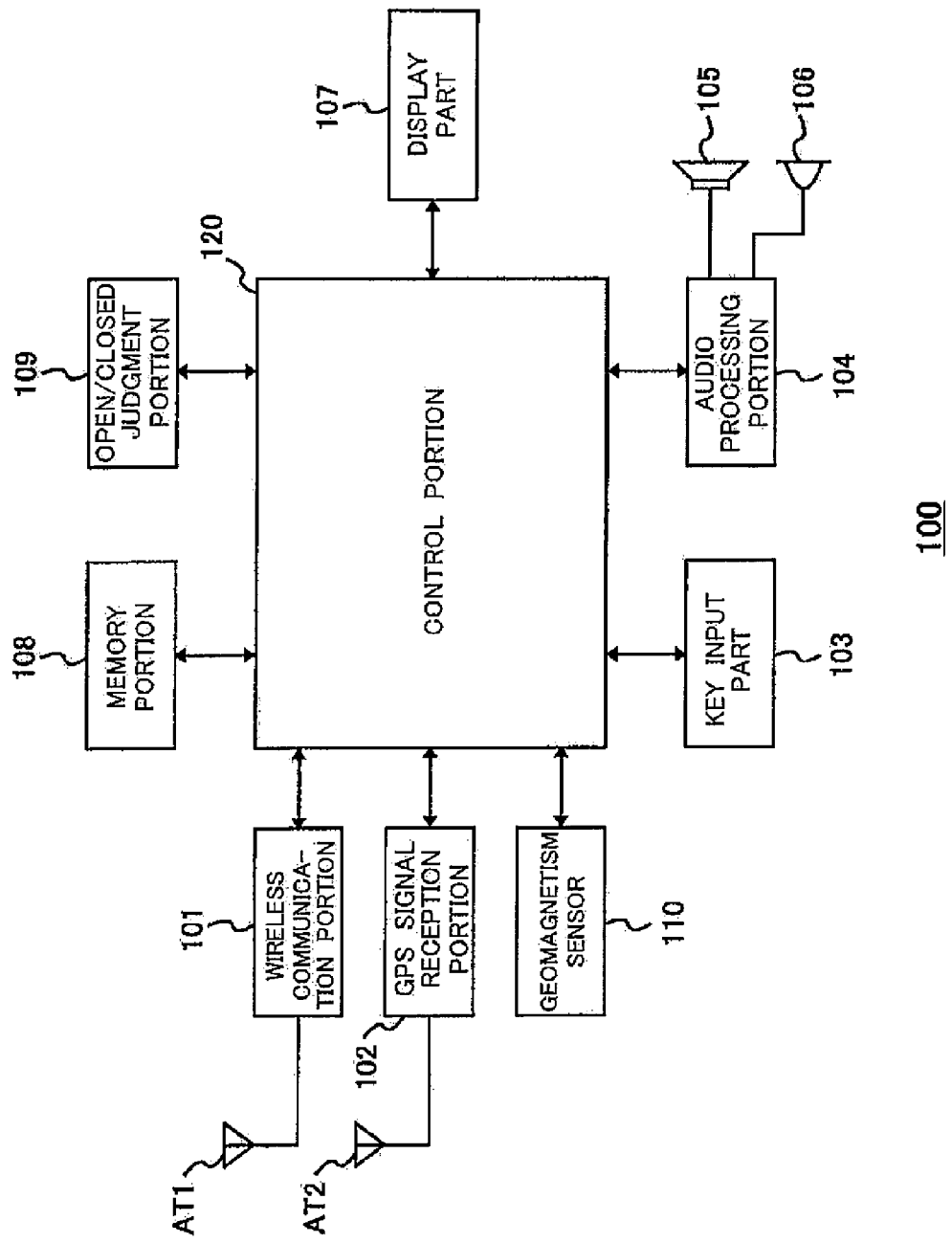
FIG. 3 A block diagram showing an example of the configuration of a mobile phone according to an embodiment of the present invention.

FIG. 3 is a block diagram showing an example of the configuration of the mobile phone 100 according to the embodiment of the present invention.

The mobile phone 100 shown in FIG. 3 has a wireless communication portion 101, GPS signal reception portion 102, key input part 103, audio processing portion 104, speaker 105, microphone 106, display part 107, memory portion 108, open/closed judgment portion 109, geomagnetism sensor 110, and control part 120.

The wireless communication portion 101 performs processing concerning wireless communication with the base station 300. For example, it applies predetermined modulation processing to transmission data output from the control part 120 to convert it to a wireless signal which it transmits from the antenna AT1. Further, it applies predetermined demodulation processing to the wireless signal received at the antenna AT1 to reproduce the reception data and outputs the same to the control part 120.

The GPS signal reception portion 102 receives the GPS signals transmitted from the GPS satellites 200 and applies amplification, noise elimination, modulation, or other signal processing to acquire information required for calculating the geographical position of the mobile phone 100 at the GPS server 401.

The key input part 103 has keys to which various functions are assigned, for example, a power key, a talk key, number keys, letter keys, direction keys, and an execute key. When such a key is operated by the user, a signal corresponding to that operation content is generated. This is input as an instruction of the user to the control part 120.

The audio processing portion 104 processes the audio signal output at the speaker 105 and audio signal input at the microphone 106. Namely, it applies amplification, analog-to-digital conversion, encoding, or other signal processing to the audio signal input from the microphone 106, converts this to digital audio data, and outputs the same to the control part 120. Further, it applies decoding, digital-to-analog conversion, amplification, or other signal processing to the audio data supplied from the control part 102, converts the same to an analog audio signal, and outputs this to the speaker 105.

The display part 107 is configured by using a display device, for example, a liquid crystal display panel or an organic EL panel, and displays an image in accordance with a video signal supplied from the control part 120. For example, a phone number of a destination at the time of making a call, a phone number of the other party in reception at the time of reception, the content, date, and time of the reception mail or transmission mail, remaining battery life, waiting screen, and other various types of information and images are displayed. Further, as will be explained later, when performing the navigation, a map of the periphery of the present location is displayed.

The memory portion 108 stores various types of data utilized for the processing in the control part 120. For example, a program of a computer provided in the control part 120, an address book managing phone numbers, e-mail addresses, and other personal information, an audio file for playing back a reception sound and an alarm sound, various types of setting data, temporary data utilized in the processing step of the program, and so on are retained.

The storage portion 108 is configured by, for example, a non-volatile memory device (non-volatile semiconductor memory, hard disc device, optical disc device, etc.), or a random accessible memory device (for example, SRAM or DRAM).

The open/closed judgment portion 109 judges the open/closed state of the first housing 501 and second housing 502 connected via the hinge portion 503. For example, the open/closed judgment portion 109 includes a switch or other detector detecting the closed state when a superimposed state of the first housing 501 and the second housing 502 is exhibited and distinguishes between the closed state and the state other than this.

The geomagnetism sensor 110 detects the geomagnetism used for the calculation of the bearing.

The geomagnetism sensor 110 is, for example, arranged on a circuit board of the inside of the second housing 502, uses a predetermined coordinate system (biaxial or triaxial) set on the circuit board as a standard, and detects the geomagnetism in each of those axial directions. For the detection of the geomagnetism, use is made of various methods, for example, a method of detecting a resistance value of a magnetoresistance device, a method of utilizing excitation of a coil, and a method of utilizing the Hall effect.

The geomagnetism sensor 110 is configured by, for example, a device portion (magnetoresistance device etc.) fluctuating in state due to magnetism and a driver portion periodically detecting the fluctuation value of this device portion. The control part 120 drives the driver portion based on a program of an electronic compass included in the navigation program etc. stored in the memory portion 108 and makes it perform periodic detection and further periodically detects this detection result. Then, by correcting an offset error explained later from the detection values of the device portion and driver portion, the correct bearing is calculated. In the present embodiment, the processing concerning this calculation of the offset error and the correction is sometimes called "calibration" of the geomagnetism sensor 110.

The control part 120 centrally controls the overall operation of the mobile phone 100. Namely, it controls the operations of the units explained above (transmission/reception of signals at the wireless communication portion 101, reception operation of GPS signals at the GPS signal reception portion 102, input/output of audio at the audio processing portion 104, display of images on the display part 107, etc.) so that various processing (audio speech performed via a line switching network, preparation and transmission/reception of e-mails, inspection of web site of Internet, navigation processing, etc.) of the mobile phone 100 is executed in a suitable order in response to the operation of the key input part 103.

For example, the control part 120 is provided with a computer executing processing based on a program (operating system, application, etc.) stored in the memory portion 108 and executes the processing explained above according to the order instructed in this program.

The control part 120 performs, as processing relating to the navigation function, processing calculating the bearing based on the detection value of the geomagnetism sensor 110, processing transmitting information of GPS signals received at the GPS signal reception portion 102 to the GPS server 401 and acquiring the position information of the present location, processing transmitting this position information to the navigation server 402 and acquiring the information of a map of the periphery of the present location, processing calculating the present location based on a positioning use signal from the base station 300 and the calculation result of the bearing, processing controlling orientation of a map on the screen of the display part 107 (heading up display processing) in accordance with the calculation result of the bearing, and so on. The control part 120 executes these processing according to an application program for navigation (hereinafter described as a "navigation application").

Further, when no key operation is not performed for a predetermined time or more at the key input part 103, the control part 120 shifts to the power-saving mode reducing the power consumed on the display part 107 and other units. When shifting to the power-saving mode, the control part 120, for example, stepwise reduces the illumination of the display part 107 (backlight etc. of the LCD panel) up to zero. If a state without any key operation further continues even when the illumination becomes zero, the control part 120 stops driving the pixels on the display part 107.

The power-saving mode may be shifted to not only when no key operation is not made at the key input part 103, but also, for example, when the closed state is judged at the open/closed judgment portion 109 (that is, the state where the screen of the display part 107 is covered).

When any key of the key input part 103 is operated in this power-saving mode, the control part 120 ends the power-saving mode to return to an ordinary operation mode and executes the processing concerning the calibration of the geomagnetism sensor 110. As the processing concerning the calibration, for example, a message prompting the calibration of the geomagnetism sensor 110 is displayed on the display part 107 or the geomagnetism sensor 110 is automatically calibrated.

Inside the portable electronic apparatus 100, electronics parts and metal parts, for example, a shield case, a memory card holder, and a reinforcing metal sheet are included. These are magnetized to become magnetic when subjected to a strong magnetic field and have polarity and generate a magnetic field.

On the other hand, the inside of the mobile phone 100 is cramped. In the geomagnetism sensor 110, parts which are easily magnetized as described above are laid out in close proximity. For this reason, the geomagnetism sensor 110 senses, other than the magnetic field due to pure geomagnetism, the magnetic fields generated by the magnetized parts inside the mobile phone 100. The calibration of the geomagnetism sensor 100 calculates and corrects fixed offset error of the detection value occurring based on the magnetic fields inside the mobile phone 100.

When rotating the mobile phone 100 with respect to the horizontal plane, the magnetic field of the geomagnetism applied to the geomagnetism sensor 110 changes along with the rotation operation, but the magnetic fields generated by the parts inside the mobile phone 100 fixed in positional relationships with respect to the geomagnetism sensor 100 do not change by the rotation operation. Therefore, for example, while the user is made to execute the operation of rotating the housings of the mobile phone 100 horizontally with respect to the horizontal plane (that is, the operation of changing the 2 axes' worth of the parameters of the geomagnetism sensor 100), the control part 120 acquires a plurality of detection values of the geomagnetism sensor 100 and calculates the fixed offset value based on these plurality of detection values.

Note that when the geomagnetism sensor 110 can detect the geomagnetism along three axes or more, by sequentially acquiring samples by changing the detection method for each axis, it is possible to calculate the offset error without rotating the housings (that is, automatic calibration).

At the time when a key of the key input part 103 is operated in order to return from the power-saving mode, it is expected that the user will try to view the screen of the display part 107.

On the other hand, the result of calibration of the geomagnetism sensor 110 changes in accordance with the angle of the housings with respect to the horizontal plane. The control part 120 performs the calibration computation so that the bearing can be calculated with the best precision in a state where the information of the bearing is displayed to the user (that is, housings become schematically horizontal with respect to the horizontal plane).

Accordingly, by executing processing concerning calibration in the state where the user tries to view the screen of the display part 107, the calibration processing can be executed in a state where the angle of housings with respect to the horizontal plane is suitable, therefore the precision of calculation of the bearing is improved.

The control part 120 may perform the processing concerning the calibration explained above every time when it returns from the power-saving mode in response to an operation of the key input part 103. Note that when the detection value of the geomagnetism sensor is not utilized for a purpose other than the calculation of the bearing, even when the calibration is carried out whenever it returns from the power-saving mode, it becomes useless. In that case, the processing concerning the calibration may be executed when it returns from the power-saving mode during activation of the navigation application (program concerning the calculation and display of the bearing).

For example, where the key input part 103 is not operated for a predetermined time or more during the activation of the navigation application, the control part 120 shifts to the power-saving mode explained above. The screen display of the display part 107 disappears during the power-saving mode. However, in order to enable smooth display of the correct bearing after returning from the power-saving mode, the control part 120 continues the calculation of the bearing even in the power-saving mode. When the power-saving mode ends by the operation of the key input part 103 in such a state, the control part 120 executes processing concerning the calibration of the geomagnetism sensor 110.

Further, in the activation of the navigation application, when a key different from the key for controlling the progress of the navigation application is operated at the key input part 103, the control part 120 may execute processing concerning the calibration as well.

When a key of the key input part 103 is operated in the activation of the navigation application, it is expected that the user will try to view the screen display of the display part 107. For example, a situation where a suitable key is depressed for only the purpose of preventing the shift to the power-saving mode so that the screen does not become dark due to a shift to the power-saving mode is anticipated. Accordingly, by executing the calibration processing in response to a key operation in the activation of the navigation application, there is a good chance that the calibration use offset can be acquired in the state where the angle of housings with respect to the horizontal plane is suitable, therefore precision of calculation of the bearing is improved.

Further, if the calibration processing is executed in the case where a key for controlling the progress of the navigation application (for example, a key used for movement, magnification, rotation, etc. of the map) is operated, the frequency of calibration becomes higher than the necessity. However, if the calibration processing is executed at the time when a key different from such a key (that is, a key not assigned to the navigation application) is operated, the frequency of the calibration is reduced, and an increase of the power consumed is suppressed.

Further, the control part 120 provides a constant waiting time during a period from when a key of the key input part 103 is operated in the power-saving mode to when the processing concerning the calibration of the geomagnetism sensor 110 is executed. Due to this, the calibration is carried out while avoiding the unstable state of housings immediately after the key operation, therefore a suitable offset value can be acquired, and the precision of calculation of the bearing is improved.

Note that, when a key of the key input part 103 is further operated in the middle of this waiting time, the control part 120 further extends the waiting time by, for example, exactly a predetermined time. Due to this, in the same way as the above explanation, the sensor can be calibrated while avoiding the unstable state of the housings.

Further, in this case, the control part 120 may execute processing concerning calibration as well after once executing the processing corresponding to the key operated in the middle of the waiting time. When the processing capability of the control part 120 is not that high, by preventing the processing concerning the calibration and the processing corresponding to a key operation from a parallel execution, a drop of the processing speed can be suppressed.

Furthermore, the control part 120 does not execute the processing concerning the calibration in the case where the closed state is judged at the open/closed judgment portion 109 (that is, the case where the screen of the display part 107 is covered by the first housing 501).

As previously explained, the control part 120 performs the calibration computation so that the bearing can be calculated with the highest precision in the state where information of the bearing is displayed to the user. For this reason, by not calibrating the sensor in the closed state not displaying the information of the bearing, a drop of the calculation precision of the bearing is prevented.

Here, an explanation will be given of the operation of the mobile phone 100 having the configuration explained above focusing on the navigation function according to the present invention.

First, the reception processing of the GPS signal will be explained.

Figure 4:
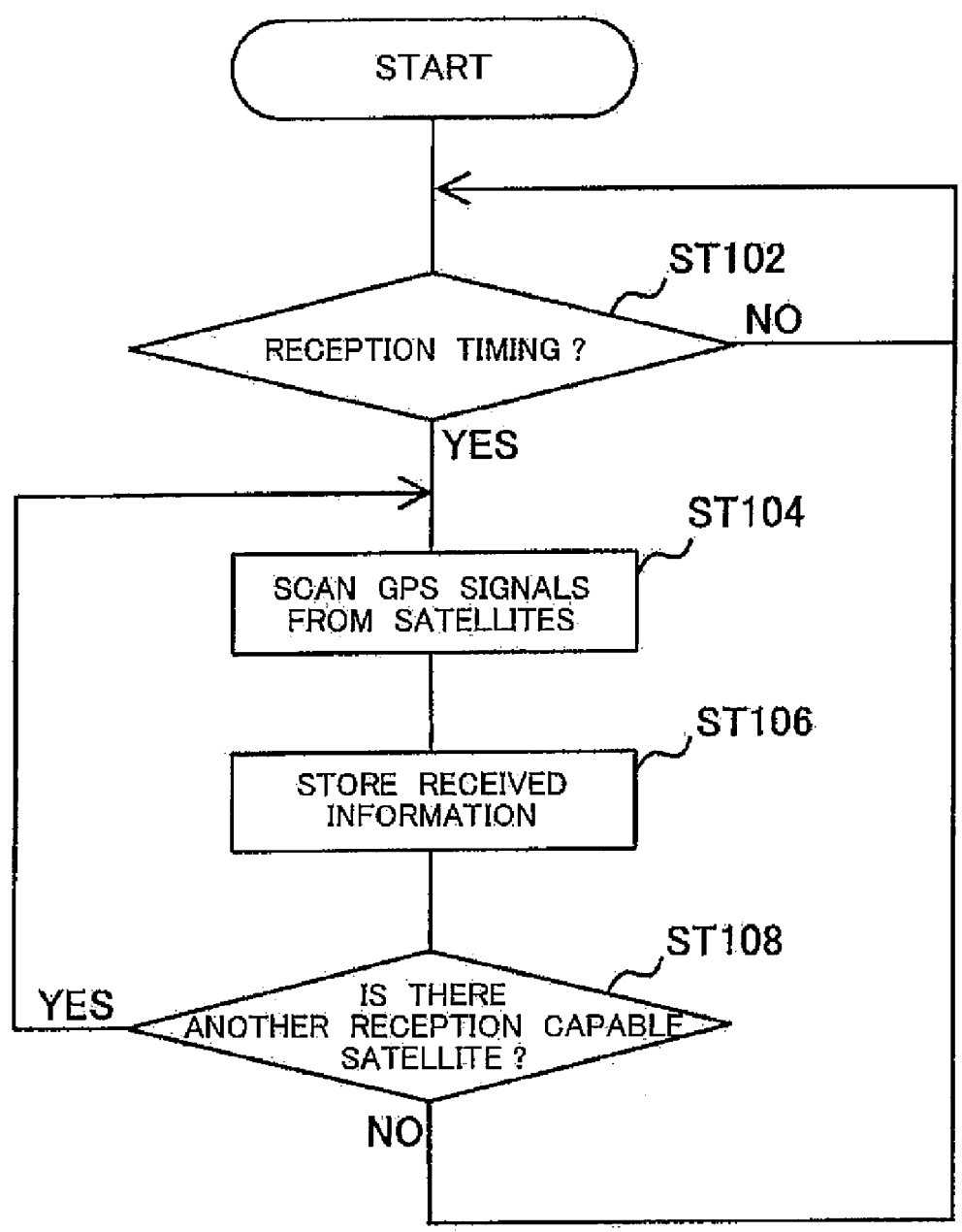
FIG. 4 A flow chart showing an example of GPS signal reception processing in a mobile phone.

FIG. 4 is a flow chart showing an example of the GPS signal reception processing in the mobile phone 100.

The control part 120 controls the GPS signal reception portion 102 at a constant timing, for example, intervals of 2 seconds and scans for GPS signals from satellites (steps ST102 and ST104). When the GPS signal can be received as a result of scanning, that information is stored in the memory portion 108 (ST106). Such scanning of the GPS signal and storage of information are repeated for all of the satellites able to be received from (steps ST108 ST104, ST106). When all satellites have been scanned, the processing of steps ST104 to 108 is carried out again after waiting for the next GPS signal reception timing. The control part 160 always executes such GPS signal reception processing in a period where, for example, the power is ON.

Next, the navigation processing will be explained.

Figure 5:
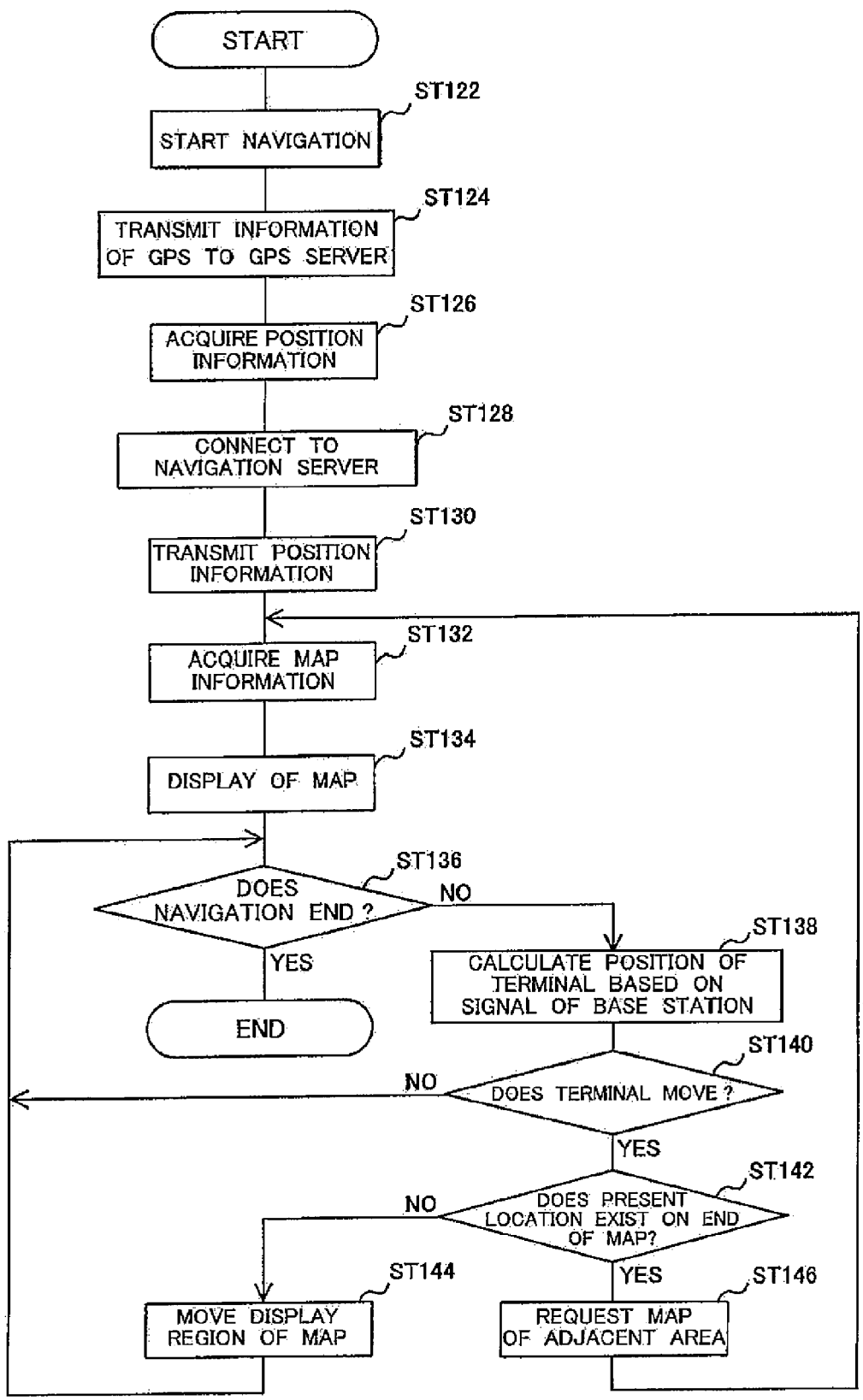
FIG. 5 A flow chart showing an example of navigation processing.

FIG. 5 is a flow chart showing an example of the navigation processing.

In the control part 120, for example, when the start of the navigation processing is selected by a key input operation etc. at the key input part 103 (step ST122), the control part 120 activates the navigation application. First, the control part 120 performs processing transmitting the information obtained by the GPS reception processing explained above from the wireless communication portion 101 via the base station 300 and communication network to the GPS server 401 (step ST124).

When receiving the information of GPS from the mobile phone 100, the GPS server 401 calculates the position of the present location (for example, information of latitude and longitude) of the mobile phone 100 based on this received GPS information and transmits the calculation result through the communication network and the base station 300 to the mobile phone 100.

The mobile phone 100 receives the position information transmitted from the GPS server 401 and stores it in the storage portion 108 (step ST126).

Next, the control part 120 accesses the navigation server 402 from the wireless communication portion 101 via the base station 300 and communication network (step ST128) and transmits the acquired position information to the navigation server 402 (step ST130).

When receiving the position information from the mobile phone 100, the navigation server 402 retrieves from the database the information of a map of the periphery of the present location of the mobile phone 100 specified by this position information and transmits the retrieved map information through the communication network and the base station 300 to the mobile phone 100.

The mobile phone 100 receives the map information transmitted from the navigation server 402 and stores it in the memory portion 109 (step ST132).

Figure 6:
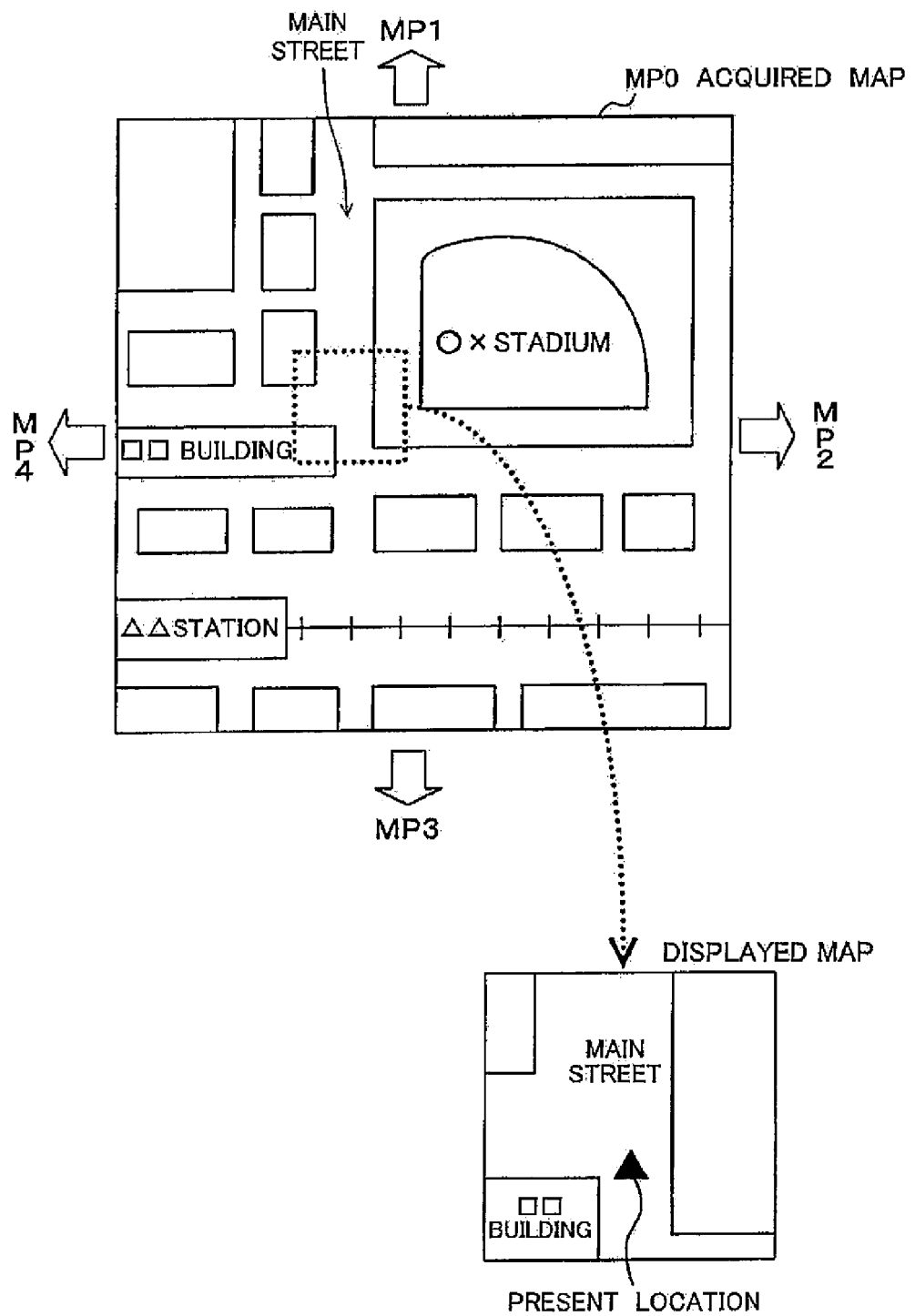
FIG. 6 A diagram showing an example of map information transmitted from a navigation server.

FIG. 6 is a diagram showing an example of the map information transmitted from the navigation server 402.

Figure 7:
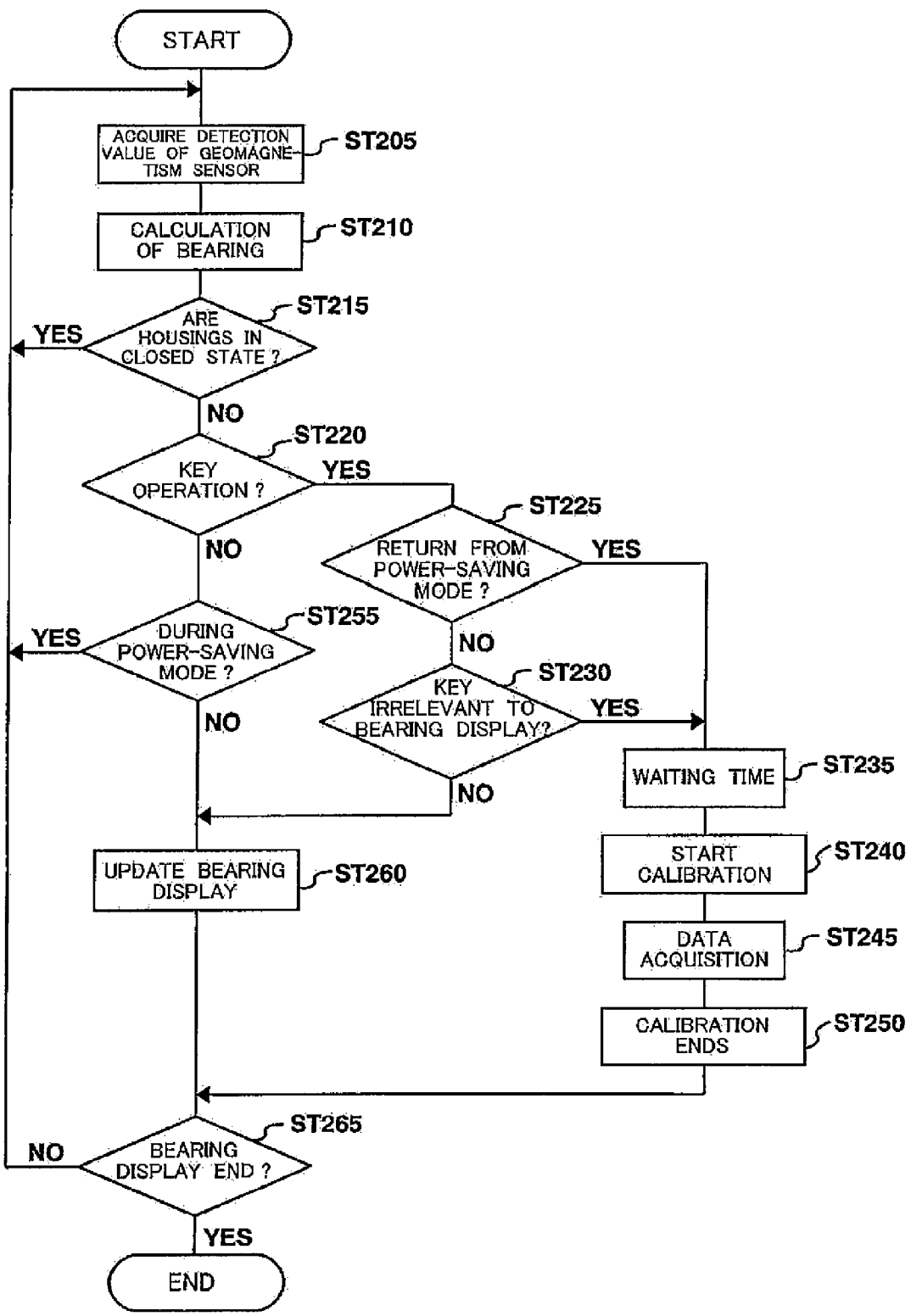
FIG. 7 A flow chart showing a first example of processing concerning calculation and display of a bearing.

In the present embodiment, as an example, it is assumed that an identification number inherent to the map information is assigned to each. The navigation server 402, based on this identification number, manages the map data for each predetermined size (for example, 1 km square), attaches this identification number to the data of the map, and transmits where the map information is transmitted to the mobile phone 100. In the example of FIG. 7, the map of the periphery of the present location has an identification number MP0. The maps on the four sides thereof have identification numbers MP1 to MP4.

When such map information is acquired, the control part 160 generates image data of the map of the periphery of the present location based on the acquired map information and makes the display panel of the display part 107 display the map (step ST134).

A region of the map displayed on the display panel is, for example, as shown in FIG. 6, a region (for example, 200 m×300 m) acquired from the navigation server 402 and narrower than the map of 1 km square.

As the display method of the map, for example, it is possible to select either of a north up display (the display directing the north on the map to the top of the screen) or the heading up display (the display directing the advancing direction on the map to the top of the screen).

When the north up display is selected by a key operation of the key input part 103, the control part 120 makes the display part 107 fix the north direction of the map to the upward direction of the display screen for display.

On the other hand, when heading up display is selected by a key operation of the key input part 103, the control part 120 controls the orientation of the map on the display screen in accordance with the bearing calculated based on the detection value of the geomagnetism sensor 110. For example, the orientation of the map is controlled so that the bearing of the advancing direction is directed upward on the display screen.

When the display of the map is started as explained above, the control part 120 repeats the processing of step ST138 and the following steps explained next during the period up to when an end of the navigation processing is selected by the key operation of the key input part 103 (step ST136).

First, the control part 120 makes the wireless communication portion 101 receive the positioning use reference signals transmitted from a plurality of (for example, three or more) base stations 300 at the periphery of the mobile phone 100 and calculates the position of the present location based on those received signals (step ST138). Then, any movement of the mobile phone 100 is judged from the result of calculation of the present location (step ST140). When it is judged that the mobile phone 100 does not move, the present location is continuously calculated based on the reference signals from the base stations 300 (ST138).

At step ST140, when it is judged that the mobile phone 100 moved, the control part 120 judges whether or not the location of the destination is in the region on the end of the map which is acquired at present (step ST142). For example, when a part of the map to be displayed on the display part 107 is not included in the map which is acquired at present, but included in the map adjacent to this, it is judged that the present location is in the region on the end of the map.

When it is judged that the present location is in the end region, the control part 120 requests the map adjacent to this end region to the navigation server 146 (step ST146). For example, the identification number of the map being acquired present and information for instructing to which bearing among east, west, north, and south is it adjacent with respect to this map are transmitted to the navigation server 146.

The navigation server 402 detects the map in accordance with the information sent from the mobile phone 100 from the database and transmits the same to the mobile phone 100.

The mobile phone 100 receives the map information transmitted from the navigation server 402 and stores it in the memory portion 109 (step ST132). Further, it makes the display part 107 display the map in accordance with this map information (step ST134). After that, the processing of step ST138 and on is repeated.

Further, when it is judged that the present location does not exist in the end region, the control part 120 performs, for example, processing for moving the display region of the map so that the present location of the mobile phone 100 becomes the center of the map in accordance with the result of calculation of the present location and repeats the processing of step S138 and on after that.

Next, an explanation will be given of the calculation and display of the bearing in the navigation application.

FIG. 7 is a flow chart showing a first example of the processing concerning the calculation and display of the bearing.

The control part 120 acquires the detection value of the geomagnetism sensor 100 (step ST205) and calculates the bearing based on this acquired detection value and the offset value stored in the memory portion 109 (step ST210).

Then, the control part 120 confirms if the closed state is judged at the open/closed judgment portion 109 (step ST215), returns to step ST205 without performing the following processing (update processing ST260 of the bearing display and calibration processing ST240, ST245, ST250) in the case of the closed state, and repeats the detection of the geomagnetism and the calculation of the bearing.

When the closed state is not judged at the open/closed judgment portion 109 (that is, in the case of the open state), the control part 120 judges whether a key operation was carried out at the key input part 103 (step ST220). When a key operation was carried out, it judges whether the apparatus has returned from the power-saving mode to the ordinary operation mode (step ST225).

When it returns from the power-saving mode by a key operation, the control part 120 waits for the predetermined waiting time (step ST235), then executes the processing concerning the calibration (ST240, ST245, and ST250).

For example, the control part 120 displays a message or image prompting the calibration on the display part 107, makes the user rotate the housings of the mobile phone 100 or perform other operation, and acquires detection values of geomagnetism in a plurality of directions from the geomagnetism sensor 110 for that term (step ST240). The control part 120 acquires the data of the offset value based on detection values of geomagnetism acquired by the geomagnetism sensor 110 (step ST245). When the geomagnetism sensor 110 is a triaxial type, the data of the offset value may be acquired by automatic calibration which does not need the rotation of the housings as well. The control part 120 stores the acquired data of the offset value in the memory portion 108 and ends the calibration (step ST250). After the calibration, if the navigation application is in active, it returns to step ST205 again where it repeats the detection of the geomagnetism and the calculation of the bearing (step ST265).

Further, when a key operation is carried out at the key input part 103 and that key is a key irrelevant to the control of the navigation application (step ST230), in the same way as the above explanation, after waiting for a predetermined waiting time 135 (step ST235), the control part 120 executes the processing concerning the calibration (ST240, ST245, ST250).

On the other hand, when shifting to the power-saving mode without operation to the key input part 103 during the activation of the navigation application (step ST255), the control part 120 does not perform the update processing (ST260) of the bearing display and the calibration processing (ST240, ST245, ST250), but returns to step ST205 where it repeats the detection of the geomagnetism and the calculation of the bearing.

When the housings are in the open state (step ST215), no key operation is performed at the key input part 103 (step ST220), and the mode is not during the power-saving mode (step ST255), the control part 120 updates the display of the bearing on the display part 107 (step ST260). For example, the image showing the bearing at present is updated (a picture of the compass is rotated etc.) or the orientation of the map is updated when the heading up display is carried out.

Further, in the case where the housings are in the open state (step ST215), a key operation was made at the key input part 103 (step ST220), but when its key operation was made under the circumstance of not-power saving mode, the return processing from the power saving mode is not occurred (step ST225), and a key irrelevant to the control of the navigation application is not operated either (step ST230), in the same way as the above explanation, the control part 120 updates the display of the bearing on the display part 107. After the updating of the bearing display, if the navigation application is being activated, the operation returns to step ST205 again and repeats the detection of the geomagnetism and the calculation of the bearing (step ST265).

As explained above, according to the present embodiment, when a key of the key input part 103 is operated in the power-saving mode, the power-saving mode ends and processing concerning the calibration of the detection values of the geomagnetism sensor 110 is executed. Due to this, the processing concerning the calibration is executed in the state where the user tries to view the screen of the display part 107, therefore the calibration processing is executed in the state where the angle of housings with respect to the horizontal plane is suitable, and the calculation precision of the bearing can be improved.

Further, by executing the processing concerning the calibration in the activation of the navigation application (program concerning the calculation and display of the bearing), useless calibration in the state where the calculation and display of the bearing are not carried out is not carried out, therefore the increase of the power consumed can be suppressed.

Further, according to the present embodiment, in the activation of the navigation application, when a key of the key input part 103 which is different from the key for controlling the progress of the navigation application is operated, the processing concerning the calibration is executed. Due to this, by executing the calibration processing in response to the key operation in the activation of the navigation application, the processing concerning the calibration is executed in the state where the angle of the housings with respect to the horizontal plane is suitable, therefore, the calculation precision of the bearing can be improved. Further, unnecessary calibration does not have to be carried out compared with the case where the calibration is executed whenever a key for controlling the progress of the navigation application is operated, and the increase of the power to be consumed can be suppressed.

In addition, during the period from when a key of the key input part 103 is operated in the power-saving mode to when the processing concerning the calibration of the geomagnetism sensor 110 is executed, by providing a constant waiting time, the calibration is carried out while avoiding the unstable state of the housings immediately after the key operation, therefore the calculation precision of the bearing is improved.

Next, an explanation will be given of a second example of the processing concerning the calculation and display of the bearing with reference to the flow chart of FIG. 8.

Figure 8:
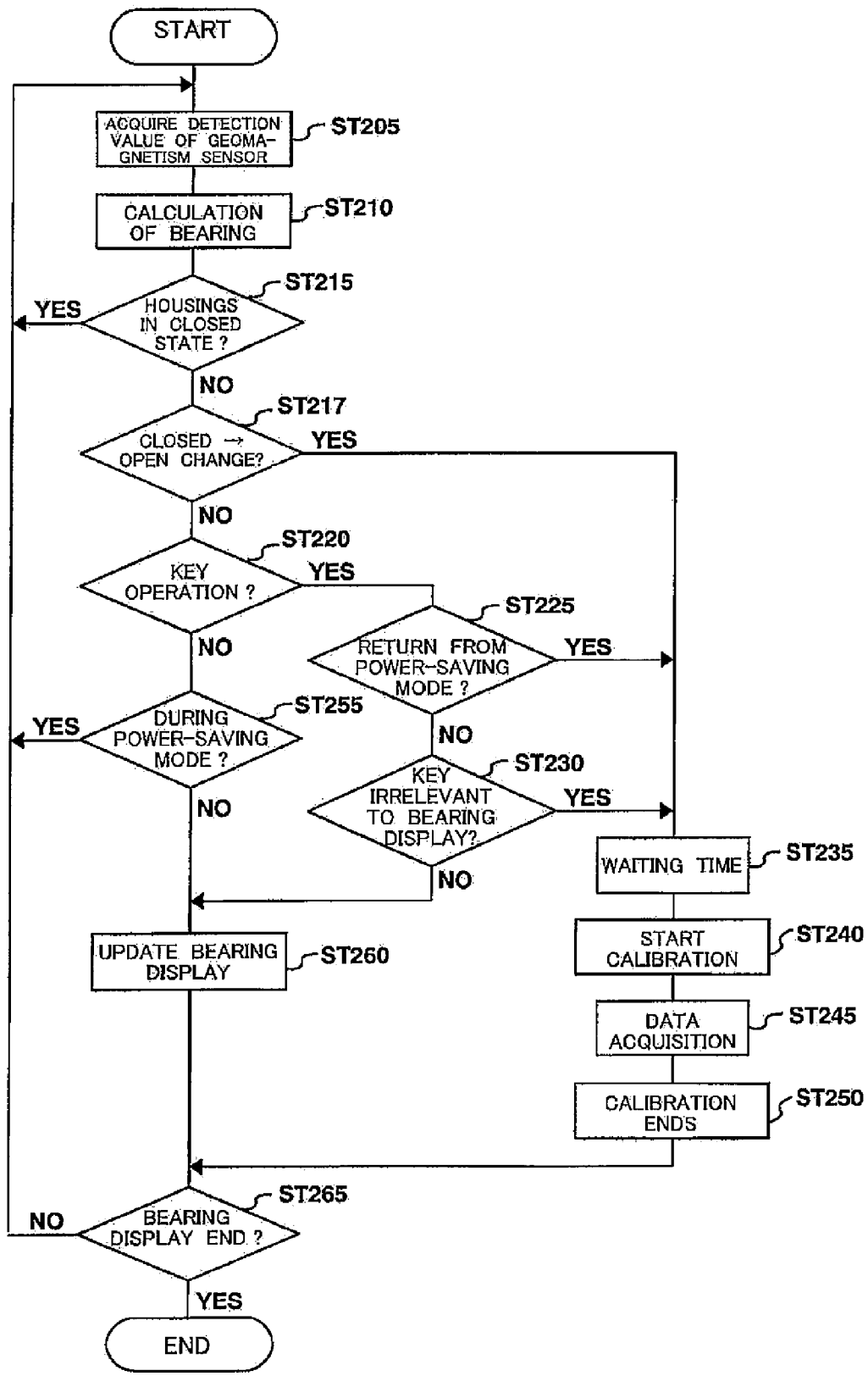
FIG. 8 A flow chart showing a second example of processing concerning calculation and display of a bearing.

The flow chart of FIG. 8 is one obtained by adding step ST217 to the flow chart of FIG. 7.

When judging at step ST215 that the housings are not in the closed state (that is, the open state), the control part 120 further judges at step ST217 whether or not a change from the closed state to the open state occurred. When a change from the closed state to the open state occurs, the predetermined waiting time 135 is awaited at step ST235, then steps ST240, ST245, and ST250 are executed as the processing concerning the calibration.

When the housings are changed from the closed state to the open state (that is, when the covering state of the screen of the display part 107 by housings is cancelled), it is anticipated that the user will try to watch the screen of the display part 107, and a possibility that the housings form a suitable angle with respect to the horizontal plane is high. Accordingly, by executing the processing concerning the calibration when the change from the closed state to the open state occurs, the calibration processing can be executed in the state where the angle of the housings with respect to the horizontal plane is suitable, therefore the calculation precision of the bearing can be improved.

An explanation was given above of an example of the embodiment of the present invention, but the present invention is not limited to only the above embodiments.

In the above embodiment, the processing concerning the calibration is executed in the case where it returns from a power-saving mode by a key operation and the case where the change from the closed state to the open state of housings occurs, but the present invention is not limited to this. For example, in a case where provision is made of housings capable of making the operation impossible by covering the key (key operating means) of at least a part of the key input part 103, the calibration may be executed at the time when that covered state is cancelled as well. When the user is going to operate the key and going to cancel that covered state, it is anticipated that the user is going to watch the screen of the display part 107. Therefore, if the processing concerning the calibration is executed at such timing, the precision of calculation of the bearing can be improved.

Note that, in this case, the processing concerning the calibration may be executed as well when a key which has been further covered after the cancellation of the covered state of the key input part 103 is operated.

In the above embodiment, a key (pushbutton) is mentioned as an example of the means for inputting an instruction to the control part 120, but the present invention is not limited to this. Namely, the inputting means may be any means. An optional means capable of inputting an instruction of the user, for example, a dial, slide switch, pressure sensing switch, or touch panel may be included as well.

The processing of the control part 120 may be executed by software by a computer as explained above or at least a portion thereof may be executed by hardware.

The portable electronic apparatus of the present invention is not limited to a mobile phone and can be applied to various portable electronic apparatuses which can mount geomagnetism sensors, for example, portable game machines, PDAs (personal digital assistants), and notebook type computers.

The invention claimed is:

1. A portable electronic apparatus provided with a geomagnetism sensor detecting geomagnetism, a display part, an operation part, and a control part configured to calculate a bearing based on a detection value of the geomagnetism sensor and to display information of the bearing on the display part, wherein
the control part can execute power-saving processing shifting to a power-saving mode reducing power consumed by the display part when no operation is performed by the operation part for a predetermined time or more, and
the control part executes calibration-related processing concerning calibration of the geomagnetism sensor after ending the power-saving mode in accordance with an operation of the operation part in the power-saving mode.

2. A portable electronic apparatus as set forth in claim 1, wherein the control part executes the calibration-related processing after a predetermined waiting time passes after operation of the operation part occurs in the power-saving mode.

3. A portable electronic apparatus as set forth in claim 2, wherein the control part executes the calibration-related processing after a predetermined waiting time further passes from the next operation when the next operation of the operation part occurs before the elapse of the predetermined waiting time.

4. A portable electronic apparatus as set forth in claim 1, wherein the control part executes processing in response to an operation of the operation part before executing the calibration-related processing when the operation of the operation part occurs in the power-saving mode.

5. A portable electronic apparatus as set forth in claim 1, wherein
the apparatus is provided with housings composed to be able to cover a screen of the display part, and
the control part does not execute the calibration-related processing when the housings are in a state where the screen of the display part is covered.

6. A portable electronic apparatus as set forth in claim 1, wherein the control part executes the calibration-related processing when the power-saving mode ends in response to an operation of the operation part after a shift to the power-saving mode occurs in a state where processing concerning calculation and display of the bearing is executed.

7. A portable electronic apparatus as set forth in claim 1, wherein the control part executes calibration-related processing when the power-saving mode ends by operation, of the operation part, of an operation different from an operation controlling progress of processing concerning the calculation and display of the bearing after a shift to the power-saving mode occurs in a state where the processing concerning the calculation and display of the bearing is executed.

8. A portable electronic apparatus provided with a geomagnetism sensor detecting geomagnetism, a display part, a housing composed so that the screen of the display part can be covered, an operation part, and a control part configured to calculate a bearing based on a detection value of the geomagnetism sensor and to display information of the bearing on the display part, wherein
the control part can execute power-saving processing shifting to a power-saving mode reducing power consumed by the display part when the screen of the display part is covered with the housing, and
the control part executes calibration-related processing concerning calibration of the geomagnetism sensor, after ending the power-saving mode in accordance with cancellation of the state where the screen of the display part is covered with the housing.

9. A portable electronic apparatus provided with a geomagnetism sensor detecting geomagnetism, a display part, an operation part, a housing composed so that at least a part of the operation part can be covered, and a control part configured to calculate a bearing based on a detection value of the geomagnetism sensor and to display information of the bearing on the display part, wherein
the control part can execute power-saving processing shifting to a power-saving mode reducing power consumed by the display part when at least a part of the operation part is covered with the housing, and
the control part executes calibration-related processing concerning calibration of the geomagnetism sensor, after ending the power-saving mode in accordance with cancellation of the state where at least a part of the operation part is covered with the housing.

10. A portable electronic apparatus as set forth in claim 9, wherein the control part executes the calibration-related processing when the covered operation part is operated after the covered state of at least a part of the operation part is cancelled.

11. A portable electronic apparatus as set forth in claim 9, wherein the control part executes the calibration-related processing when the covered operation part is operated after the cancellation of the covered state of at least a part of the operation part, and the operation is different from an operation controlling progress of the processing.

12. A method of calibration of a geomagnetism sensor in a portable electronic apparatus provided with a geomagnetism sensor detecting geomagnetism, a display part, and an operation part, this method of calibration of a geomagnetism sensor executing
a bearing identifying step calculating a bearing based on a detection value of the geomagnetism sensor and displaying information of the bearing on the display part,
a power-saving step shifting to a power-saving mode reducing the power consumed by the display part when an operation is not performed for a predetermined time or more by the operation part, and
a calibration step calibrating the geomagnetism sensor after ending the power-saving mode in accordance with an operation of the operation part in the power-saving mode.

* * * * *